(12) United States Patent
Kim et al.

(10) Patent No.: US 11,114,372 B2
(45) Date of Patent: Sep. 7, 2021

(54) INTEGRATED CIRCUIT, CIRCUIT BOARD WITH INTEGRATED CIRCUIT, AND DISPLAY DEVICE USING THE SAME

(71) Applicant: LG DISPLAY CO., LTD., Seoul (KR)

(72) Inventors: Jungjae Kim, Paju-si (KR); Heejung Hong, Paju-si (KR); Soondong Cho, Paju-si (KR); Hyungjin Choe, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/453,552

(22) Filed: Jun. 26, 2019

(65) Prior Publication Data

US 2020/0006216 A1 Jan. 2, 2020

(30) Foreign Application Priority Data

Jun. 29, 2018 (KR) ........................ 10-2018-0075423

(51) Int. Cl.
*H01L 23/50* (2006.01)
*H05K 1/14* (2006.01)
*H05K 1/18* (2006.01)
*H01L 27/06* (2006.01)

(52) U.S. Cl.
CPC ............... *H01L 23/50* (2013.01); *H05K 1/14* (2013.01); *H05K 1/181* (2013.01); *H01L 27/0694* (2013.01); *H05K 2201/10689* (2013.01); *H05K 2201/10757* (2013.01)

(58) Field of Classification Search
CPC ... H05K 1/11; H05K 1/14; H05K 1/18; H05K 1/141–144; H05K 1/181–187; H01L 23/48; H01L 23/50; H01G 4/00; H01G 4/005; H01G 4/228

USPC .......... 361/301–308, 760–776; 174/254–260
See application file for complete search history.

(56) References Cited

U.S. PATENT DOCUMENTS

| | | | | |
|---|---|---|---|---|
| 4,949,225 A | * | 8/1990 | Sagisaka | H05K 3/202 361/720 |
| 5,025,307 A | * | 6/1991 | Ueda | H05K 1/145 257/696 |
| 5,107,324 A | * | 4/1992 | Iwahara | H01L 23/3107 257/696 |
| 5,387,762 A | * | 2/1995 | Hasegawa | H01L 21/4842 174/533 |
| 5,483,024 A | * | 1/1996 | Russell | H01L 23/4951 174/529 |
| 5,635,758 A | * | 6/1997 | Drekmeier | H01R 12/585 257/690 |
| 5,790,378 A | * | 8/1998 | Chillara | H01L 23/3121 174/537 |

(Continued)

FOREIGN PATENT DOCUMENTS

| | | |
|---|---|---|
| JP | 2786862 B2 | 8/1998 |
| JP | 4468651 B2 | 5/2010 |

*Primary Examiner* — Tuan T Dinh
(74) *Attorney, Agent, or Firm* — Birch, Stewart, Kolasch & Birch, LLP

(57) ABSTRACT

An integrated circuit includes a main body having a top and a bottom; and upper pins placed on the top of the main body, and lower pins placed on the bottom of the main body, in which each of the upper pins has a first protruding portion protruding toward outside from a side or the top of the main body, and each of the lower pins has a second protruding portion protruding toward outside from the side or the bottom of the main body.

8 Claims, 10 Drawing Sheets

(56) References Cited

U.S. PATENT DOCUMENTS

| | | | | |
|---|---|---|---|---|
| 6,043,430 | A * | 3/2000 | Chun | H01L 23/3107 174/530 |
| 6,163,460 | A * | 12/2000 | Baur | H01G 2/04 361/752 |
| 6,219,240 | B1 * | 4/2001 | Sasov | H01L 25/105 174/16.3 |
| 6,323,840 | B1 * | 11/2001 | Steinbrunner | G05G 9/047 345/156 |
| 6,339,191 | B1 * | 1/2002 | Crane, Jr. | H01L 23/057 174/541 |
| 8,050,012 | B2 * | 11/2011 | Lee | H01G 4/385 361/303 |
| 2005/0121796 | A1 * | 6/2005 | Park | H01L 23/4985 257/773 |
| 2010/0157505 | A1 * | 6/2010 | Feichtinger | H01G 4/30 361/301.4 |
| 2010/0182293 | A1 * | 7/2010 | Minamino | H05K 1/117 345/206 |
| 2013/0027155 | A1 * | 1/2013 | Feichtinger | H01G 4/40 333/185 |
| 2014/0002952 | A1 * | 1/2014 | McConnell | B23K 1/203 361/301.4 |

* cited by examiner (a)

(b)

(c)

INTEGRATED CIRCUIT, CIRCUIT BOARD WITH INTEGRATED CIRCUIT, AND DISPLAY DEVICE USING THE SAME

This application claims the benefit of Korean Patent Application No. 10-2018-0075423, filed on Jun. 29, 2018, which is incorporated herein by reference into the present application for all purposes as if fully set forth herein.

BACKGROUND OF THE INVENTION

Field of the Invention

The present invention relates to an integrated circuit, a circuit board with an integrated circuit, and a display device using the same.

Related Art

The market for displays which act as an intermediary between users and information is growing with the development of information technology. Thus, different types of display devices such as organic light-emitting displays (OLED), quantum dot displays (QDD), liquid-crystal displays (LCD), and plasma display panel displays (PDP) are increasingly used.

Some of the aforementioned display devices—for example, a liquid-crystal display or organic light-emitting display—comprise a display panel comprising a plurality of sub-pixels arranged in a matrix, a drive part that outputs driving signals for driving the display panel, and a power supply part that generates electric power to be supplied to the display panel and/or drive part. The drive part comprises a scan driver that supplies a scan signal (or gate signal) to the display panel and a data driver that supplies a data signal to the display panel.

When the driving signals, for example, a scan signal and a data signal, are supplied to the sub-pixels on the display panel, the above display device is able to display an image by allowing the selected sub-pixels to pass light through or to emit light by themselves.

SUMMARY OF THE INVENTION

The present invention provides an improved integrated circuit and an improved display device including the integrated circuit.

The present invention provide an integrated circuit and an electronic device including the integrate circuit, which would address limitations and disadvantages associate with integrated circuits of the related art.

An example of the present invention provides an integrated circuit comprising a main body and pins. The main body has a top and a bottom. The pins comprise upper pins placed on the top of the main body and lower pins placed on the bottom of the main body.

In another aspect, an example of the present invention provides a circuit board comprising a printed circuit board and an integrated circuit. The integrated circuit is mounted on the printed circuit board. The integrated circuit comprises a main body having a top and a bottom, and upper pins placed on the top of the main body and lower pins placed on the bottom of the main body.

In yet another aspect, an example of the present invention provides a display device comprising a display panel, first and second circuit boards, and first and second integrated circuits. The display panel displays an image. The first and second circuit boards are placed separately to transmit at least one of a signal and a voltage to the display panel. The first and second integrated circuits are mounted on the first and second circuit boards, respectively, and have symmetrical pin arrangements

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DESCRIPTION OF THE EMBODIMENTS

Reference will now be made in detail embodiments of the invention examples of which are illustrated in the accompanying drawings.

Hereinafter, example embodiments of the present invention will be described with reference to the accompanying drawings.

The market for displays which act as an intermediary between users and information is growing with the development of information technology. Thus, different types of display devices such as organic light-emitting displays (OLED), quantum dot displays (QDP), liquid-crystal displays (LCD), and plasma display panel displays (PDP) are increasingly used.

Some of the aforementioned display devices—for example, a liquid-crystal display or organic light-emitting display—comprise a display panel comprising a plurality of sub-pixels arranged in a matrix, a drive part that outputs driving signals for driving the display panel, and a power supply part that generates electric power to be supplied to the display panel or drive part. The drive part comprises a scan driver that supplies a scan signal (or gate signal) to the display panel and a data driver that supplies a data signal to the display panel.

When the driving signals, for example, a scan signal and a data signal, are supplied to the sub-pixels on the display panel, the display device above is able to display an image by allowing the selected sub-pixels to pass light through or to emit light by themselves. A description related to the present invention will be continued below by taking a liquid-crystal display and an organic electroluminescence display as examples. It is obvious that the present invention is also applicable to a display device using inorganic light-emitting diodes, as well as a display device using organic light-emitting diodes, or other types of display/electronic devices. Further, all components of the display/electronic devices including the integrated circuits of the present invention are operatively coupled and configured.

Figure 1:
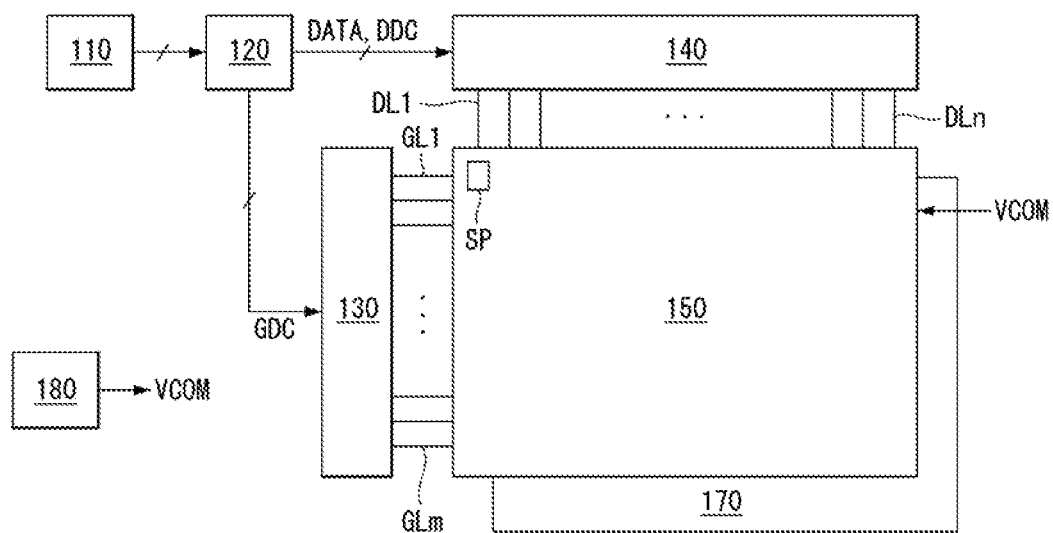
FIG. 1 is a schematic block diagram of a liquid-crystal display.
Figure 2:
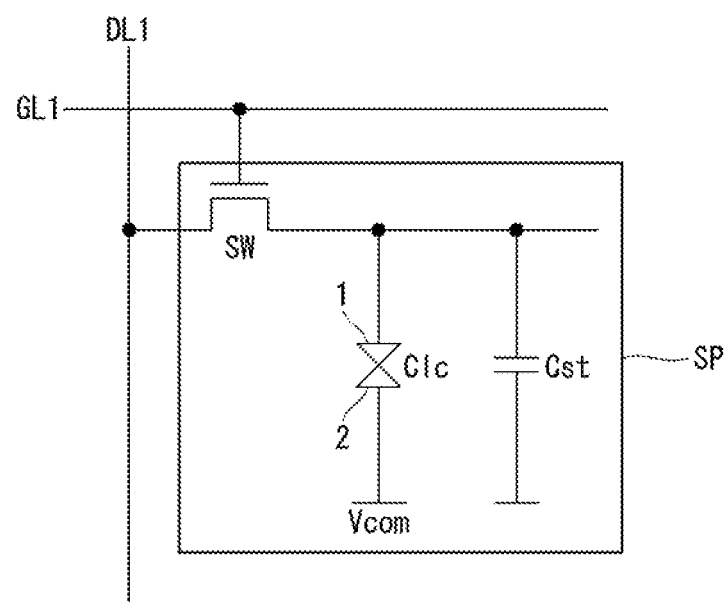
FIG. 2 is a schematic circuit diagram of a sub-pixel shown in FIG. 1.

FIG. 1 is a schematic block diagram of a liquid-crystal display. FIG. 2 is a schematic circuit diagram of a sub-pixel shown in FIG. 1.

As shown in FIGS. 1 and 2, the liquid-crystal display comprises an image providing part 110, a timing controller 120, a scan driver 130, a data driver 140, a display panel 150, a backlight unit 170, and a power supply part 180.

The image providing part 110 outputs various driving signals, along with a video data signal supplied from the outside or a video data signal stored in an internal memory. The image providing part 110 supplies a data signal and various driving signals to the timing controller 120.

The timing controller 120 outputs a gate timing control signal GDC for controlling the operation timing of the scan driver 130 and a data timing control signal DDC for controlling the operation timing of the data driver 140. The timing controller 120 supplies the data driver 140 with a data signal (or data voltage) DATA supplied from the image providing part 110, along with a data timing control signal DDC.

In response to the gate timing control signal GDC supplied from the timing controller 120, the scan driver 130 outputs a scan signal (or gate signal). The scan driver 130 supplies a scan signal to sub-pixels included in the display panel 150 through gate lines GL1 to GLm. The scan driver 130 is formed in the form of an IC (integrated circuit), or is formed directly on the display panel 150 by the gate-in-panel (GIP) technology.

In response to the data timing control signal DDC supplied from the timing controller 120, the data driver 140 samples and latches the data signal DATA, converts it to an analog data voltage corresponding to a gamma reference voltage, and outputs the analog data voltage. The data driver 140 supplies the data voltage to sub-pixels included in the display panel 140 through data lines DL1 to DLm. The data driver 140 can be formed in the inform of an IC, but is not limited thereto.

The power supply part 180 generates and outputs a common voltage VCOM based on an external input voltage supplied from the outside. The power supply part 180 can generate and output a voltage (e.g., scan-high voltage or scan-low voltage) required to run the scan driver 130 or a voltage (drain voltage or half-drain voltage) required to run the data driver 140, as well as the common voltage VCOM.

The display panel 150 displays an image, corresponding to the scan signal supplied from the scan driver 130, the data voltage supplied from the data driver 140, and the common voltage VCOM supplied from the power supply part 180. The sub-pixels on the display panel 150 control the light provided through the backlight unit 170.

For example, each sub-pixel SP comprises a switching transistor SW, a storage capacitor Cst, and a liquid crystal layer Clc. A gate electrode of the switching transistor SW is connected to a scan line GL1, and a source electrode thereof is connected to a data line DL1. One end of the storage capacitor Cst is connected to a drain electrode of the switching transistor SW, and the other end is connected to a common voltage line Vcom. The liquid crystal layer Clc is formed between a pixel electrode 1 connected to the drain electrode of the switching transistor SW and a common electrode 2 connected to the common voltage line Vcom.

The display panel 150 is implemented in TN (Twisted Nematic) mode, VA (Vertical Alignment) mode, IPS (In-Plane Switching) mode, FFS (Fringe Field Switching) mode, or ECB (Electrically Controlled Birefringence) mode, depending on the structure of the pixel electrode 1 and common electrode 2.

The backlight unit 170 provides light to the display panel 150 using a light source or the like which emits light. The backlight unit 170 can comprise, but is not limited to, light-emitting diodes (hereinafter, LEDs), an LED driver for driving the LEDs, an LED substrate where the LEDs are mounted, a light guide for converting the light coming from the LEDs into surface light, a reflector for reflecting light off the bottom of the light guide, and optical sheets for collecting and diffusing the light coming from the light guide.

Figure 3:
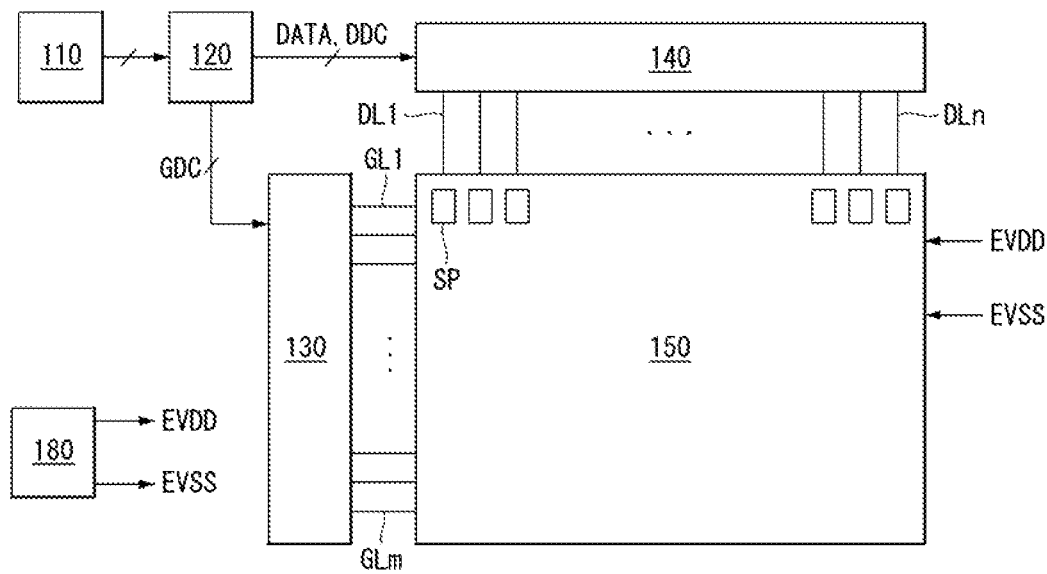
FIG. 3 is a schematic block diagram of an organic electroluminescence display.
Figure 4:
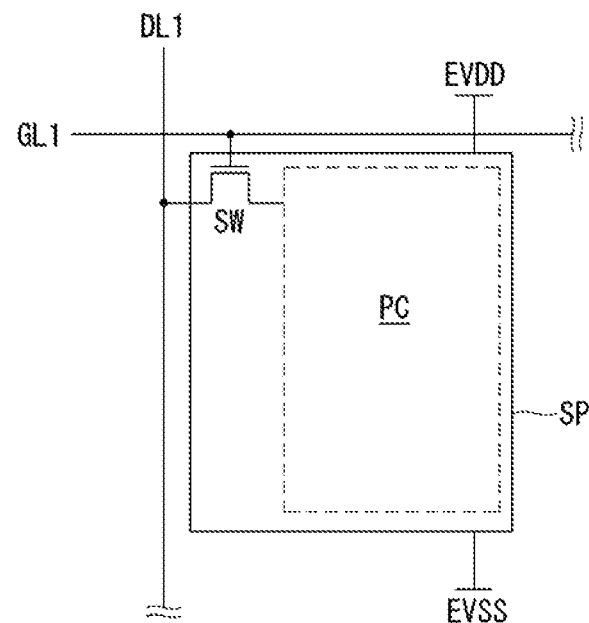
FIG. 4 is a schematic diagram of a sub-pixel shown in FIG. 3.

FIG. 3 is a schematic block diagram of an organic electroluminescence display. FIG. 4 is a schematic diagram of a sub-pixel shown in FIG. 3.

As shown in FIGS. 3 and 4, the organic electroluminescence display comprises an image providing part 110, a timing controller 120, a scan driver 130, a data driver 140, a display panel 150, and a power supply part 170.

The basic configurations and operations of the image providing part 110, timing controller 120, scan driver 130, and data driver 140 included in the organic electroluminescence display are similar to those of the liquid-crystal display of FIG. 1, so detailed descriptions thereof will be omitted. Instead, the power supply part 180 and the display panel 150, which are the most distinct from those of the liquid-crystal display, will be described in further details.

The power supply part 180 generates and outputs first power EVDD of high potential and second power EVSS of low potential based on an external input voltage supplied from the outside. The power supply part 180 can generate and output a voltage (e.g., scan-high voltage or scan-low voltage) required to run the scan driver 130 or a voltage (drain voltage or half-drain voltage) required to run the data driver 140, as well as the first and second power EVDD and EVSS.

The display panel 150 displays an image, corresponding to driving signals including a scan signal and data voltage outputted from the drive part including the scan driver 130 and data driver 140 and the first and second power EVDD and EVSS outputted from the power supply part 170. The sub-pixels on the display panel 150 emit light by themselves.

For example, each sub-pixel SP comprises a pixel circuit PC comprising a switching transistor SW, a driving transistor, a storage capacitor, an organic light-emitting diode, etc. The sub-pixels used in the organic electroluminescence display have a complex circuit configuration compared to the liquid-crystal display since they emit light by themselves. Compensation circuits for compensating for degradation of the organic light-emitting diode, which emit light, and degradation of the driving transistors, which supply a driving current to the organic light-emitting diodes, also have complex and diversified configurations. As such, it should be noted that the pixel circuit PC in each sub-pixel SP comes in block form.

Figure 5:
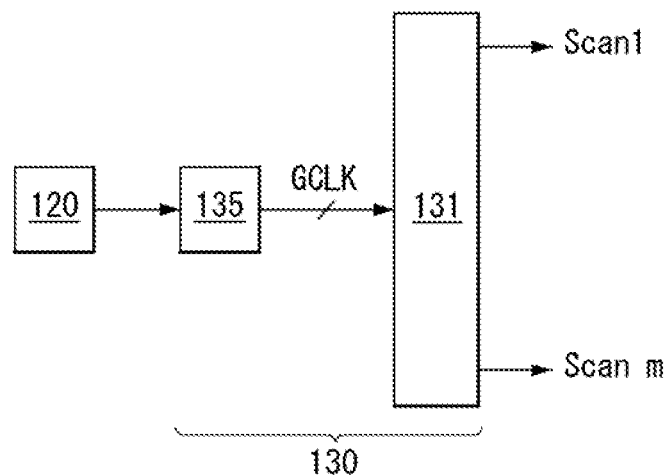
FIG. 5 is an illustration of a device related to a scan driver.
Figure 6:
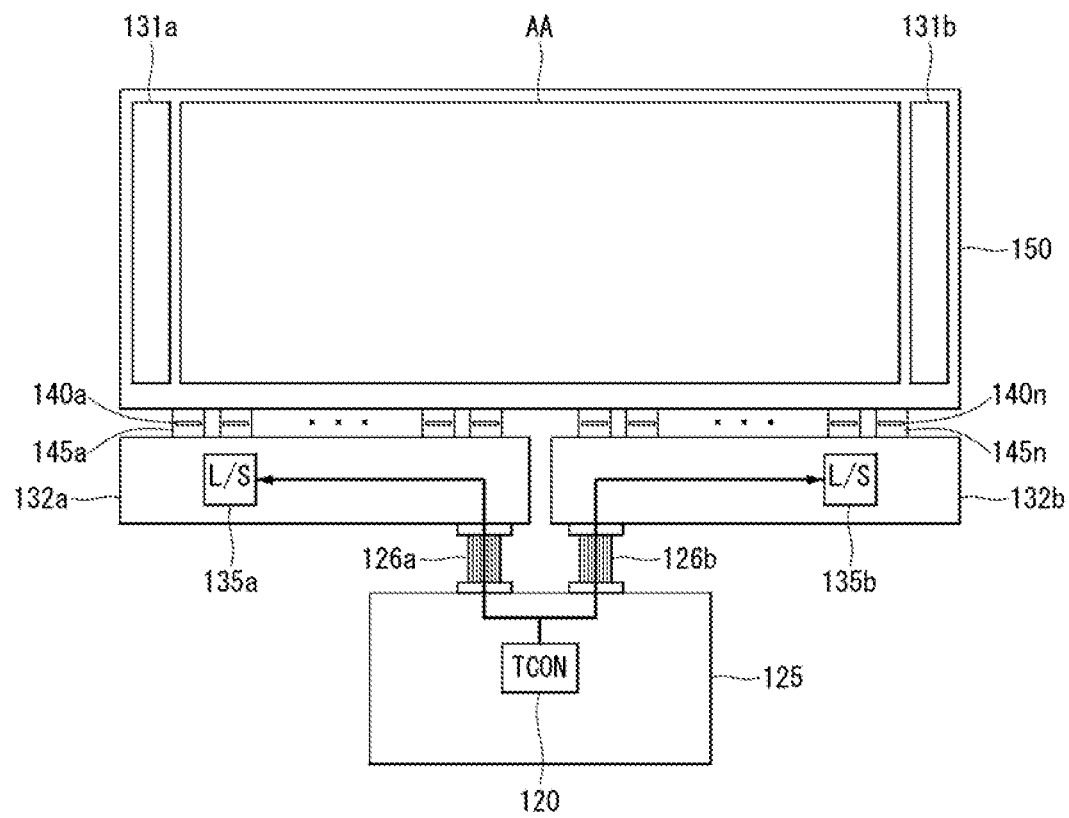
FIG. 6 is an illustration of a modular configuration of a display device.

FIG. 5 is an illustration of a device related to a scan driver. FIG. 6 is an illustration of a modular configuration of a display device.

The liquid-crystal display explained with reference to FIGS. 1 and 2 and the organic electroluminescence display explained with reference to FIGS. 3 and 4 store data voltage based on a scan signal outputted from the scan driver 130.

As shown in FIG. 5, the scan driver 130 can comprise a shift register 131 and a level shifter 135. The level shifter 135 generates and outputs a plurality of clock signals GCLK based on a signal outputted from the timing controller 120. The clock signals GCLK are generated and outputted in an N number (N is an integer equal to or greater than 2) of phases, for example, two phases, four phases, and eight phases.

The shift register 131 operates based on the clock signals GCLK outputted from the level shifter 135, and outputs scan signals Scan1 to Scanm. The shift register 131 can operate based on voltage or signal such as gate-high voltage, gate-low voltage, start signal, and reset signal, as well as clock signals. The operation of the shift register 131 can vary depending on the overall operation or driving scheme of the scan driver 130, so a detailed description thereof will be omitted.

As shown in FIG. 6, the shift registers 131a and 131b can be formed in thin film form in the non-display area outside the display area AA of the display panel 150, by using the gate-in-panel technology. In contrast, the level shifters 135a and 135b (L/S) and the timing controller 120 (TCON) are formed in the form of an IC, and therefore can be mounted on a printed circuit board separated (provided separately) from the display panel 150.

For example, the level shifters 135a and 135b can be mounted respectively on two printed circuit boards called source circuit boards 132a and 132b. The timing controller 120 can be mounted on a printed circuit board called a control circuit board 125. A plurality of flexible films 145a to 145n with a plurality of data drivers 140a to 140n respectively mounted on them are connected between the display panel 150 and the source circuit boards 132a and 132b. The display panel 150 and the source circuit boards 132a and 132b are electrically connected by the flexible films 145a to 145n. Two cables 126a and 126b are connected between the source circuit boards 132a and 132b and the control circuit board 125. The source circuit boards 132a and 132b and the control circuit board 125 are electrically connected by the two cables 126a and 126b.

However, this is merely an example, and a small-sized display, for example, can have only one level shifter 135 and its level shifter 135 and timing controller 120 can be mounted together on a single printed circuit board. Besides, other circuits, including a power supply part for supplying voltage to the display panel 150, can be mounted on at least one of the source circuit boards 132a and 132b. This way, display devices can come in various of modular configurations depending on their size or implementation and therefore are not limited to the above-described configuration.

Test Example

Figure 7:
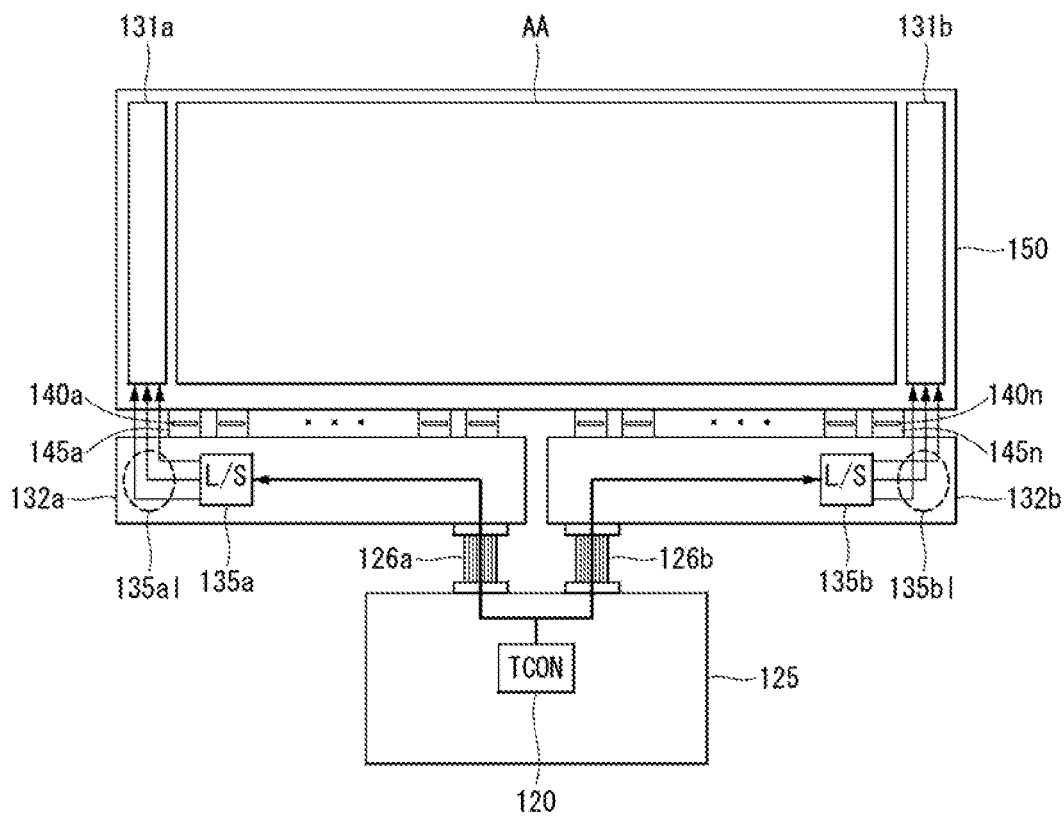
FIGS. 7 and 8 are views for explaining problems with the modular configuration of a display device according to a test example.
Figure 8:
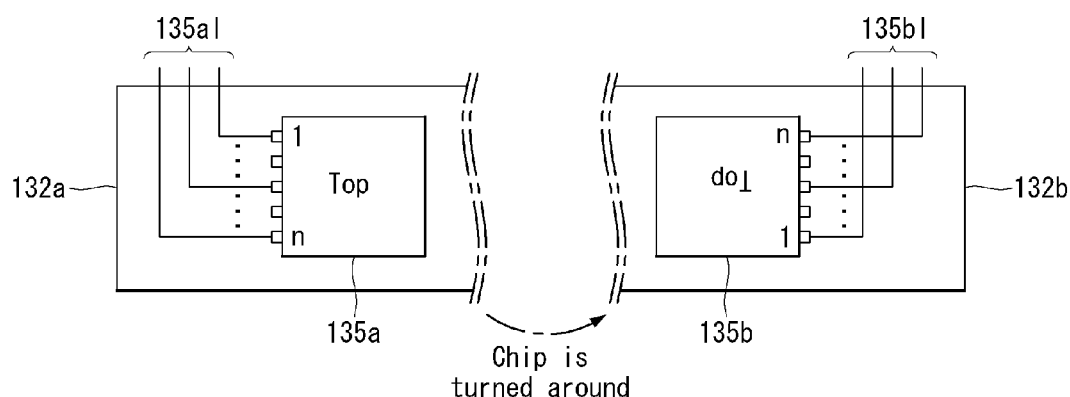

FIGS. 7 and 8 are views for explaining problems with the modular configuration of a display device according to a test example.

As shown in FIG. 7, the first and second level shifters 135a and 135b are mounted on the first and second source circuit boards 132a and 132b, respectively. A signal or voltage outputted from the first and second level shifters 135a and 135b is applied to the first and second shift registers 131a and 131b through first and second wire groups 135al and 135bl.

To this end, the first and second wire groups 135al and 135bl can be provided on the left end of the first source circuit board 132a and the right end of the second source circuit board 132b, corresponding to the positions of the first and second shift registers 131a and 131b. Moreover, the first and second wire groups 135al and 135bl can be provided on the first flexible film 145a and Nth flexible film 145n (N is an integer equal to or greater than 2) located on the left and right ends of the display panel 150.

Meanwhile, according to the modular configuration of the display device according to the test example, the second wiring group 135al has no entangled area on the first source circuit board 132a, whereas the second wire group 135bl has an entangled area on the second source circuit board 132b. The first and second wire groups 135al and 135bl can be configured differently due to the following reason.

As shown in FIG. 8, the first and second level shifters 135a and 135b are based on identically implemented (fabricated) ICs. Thus, they are mounted on the left and right ends of the first and second source circuit boards 132a and 132b after one of the ICs is turned around (the chip is turned around 180°).

Accordingly, the first and second level shifters 135a and 135b have a typical structure, which makes the tops of both of them visible. A first pin of the first level shifter 135a is placed on the upper end (the side where pads for connecting to a flexible film are present) of the first source circuit board 132a, and a first pin of the second level shifter 135b is placed on the lower end (the side where pads for connecting to a control board are present) of the second source circuit board 132b.

As a consequence, the pin arrangements of the first level shifter 135a and second level shifter 135b are asymmetrical. Due to this, when the innermost wire in the first wire group 135al is connected to the first pin of the first level shifter 135a, and the outermost wire is connected to the nth pin of the first level shifter 135a, no entangled area is created. However, when the innermost wire in the second wire group 135bl is connected to the first pin of the second level shifter 135b, and the outermost wire is connected to the nth pin of the second level shifter 135b, an entangled area is created.

Meanwhile, in the case of the first and second source circuit boards 132a and 132b, signal or power transmitting wires can be formed on first (upper) and second (lower)

surfaces where the first and second level shifters 135*a* and 135*b* are mounted. As opposed to this, in the case of a display panel, signal or power transmitting wires are formed on only one surface.

Hence, according to the test example, the second wire group 135*bl* has an entangled area on the second source circuit board 132*b*, which leads to difficulties in the design of circuit boards (such as an increased complexity of wires, an increase in the size of circuit boards, a rise in the cost of manufacturing circuit boards, and so on) and requires improvements as in the following embodiment.

Exemplary Embodiments

Figure 9:
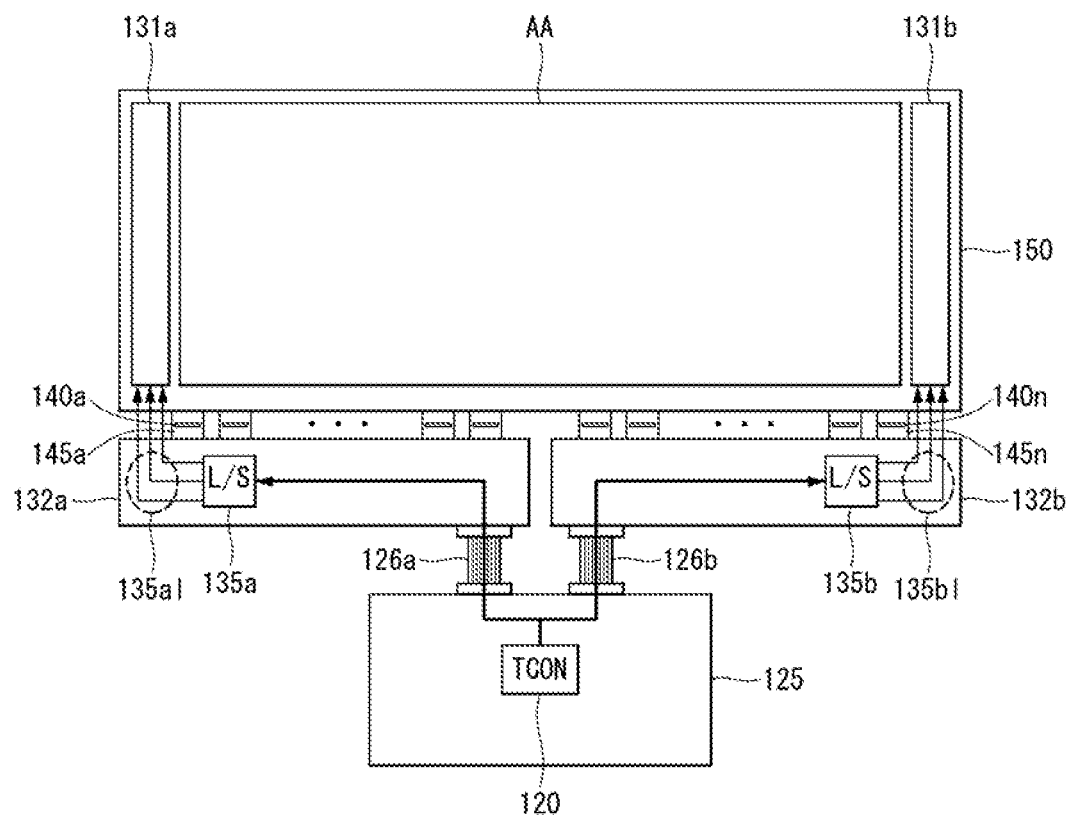
FIGS. 9 and 10 are views for explaining improvements to the modular configuration of a display device according to an exemplary embodiment of the present invention.
Figure 10:
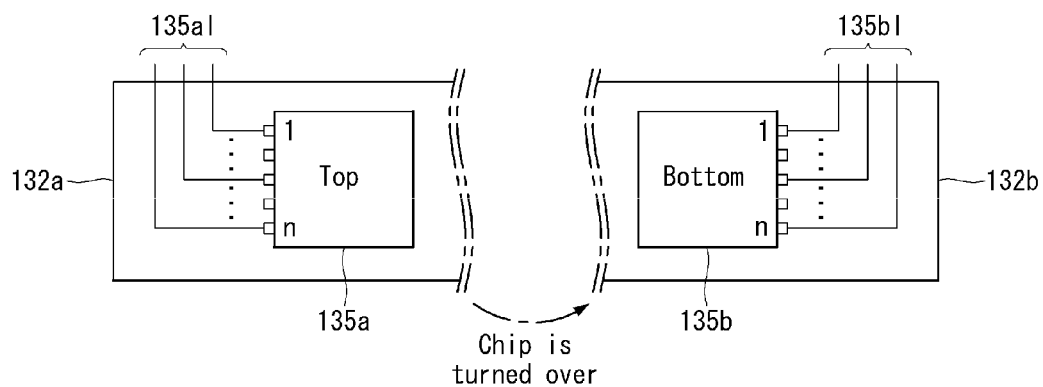

FIGS. 9 and 10 are views for explaining improvements to the modular configuration of a display device according to an exemplary embodiment of the present invention.

As shown in FIG. 9, the first and second level shifters 135*a* and 135*b* are mounted on the first and second source circuit boards 132*a* and 132*b*, respectively. A signal or voltage outputted from the first and second level shifters 135*a* and 135*b* is applied to the first and second shift registers 131*a* and 131*b* through first and second wire groups 135*al* and 135*bl*.

To this end, the first and second wire groups 135*al* and 135*bl* can be provided on the left end of the first source circuit board 132*a* and the right end of the second source circuit board 132*b*, corresponding to the positions of the first and second shift registers 131*a* and 131*b*. Moreover, the first and second wire groups 135*al* and 135*bl* can be provided on the first flexible film 145*a* and Nth flexible film 145*n* (N is an integer equal to or greater than 2) located on the left and right ends of the display panel 150.

Meanwhile, according to the modular configuration of the display device according to the exemplary embodiment, the first and second wire groups 135*al* and 135*bl* have no entangled area on the first and second source circuit boards 132*a* and 132*b*. The first and second wire groups 135*al* and 135*bl* can be configured in the same way due to the following reason.

As shown in FIG. 10, the first and second level shifters 135*a* and 135*b* are based on identically implemented (fabricated) ICs. Thus, they are mounted on the left and right ends of the first and second source circuit boards 132*a* and 132*b* after one of the ICs is turned over (the chip is turned over upside down or downside up).

Accordingly, the top of the first level shifter 135*a* becomes visible, and the bottom of the second level shifter 135*b* become visible. First pins of the first and second level shifter 135*a* and 135*b* are placed on the upper ends (the side where pads for connecting to a flexible film are present) of the first and second source circuit boards 132*a* and 132*b*, respectively.

As a consequence, the pin arrangements of the first level shifter 135*a* and second level shifter 135*b* are symmetrical. Due to this, when the innermost wire in the first wire group 135*al* is connected to the first pin of the first level shifter 135*a*, and the outermost wire is connected to the nth pin of the first level shifter 135*a*, no entangled area is created. Likewise, when the innermost wire in the second wire group 135*bl* is connected to the first pin of the second level shifter 135*b*, and the outermost wire is connected to the nth pin of the second level shifter 135*b*, no entangled area is created.

Since the pin arrangements of the first and second level shifters 135 are symmetrical, the arrangement of the first and second wire groups 135*al* and 135*bl* on the first and second source circuit boards 132*a* and 132*b* are also symmetrical.

Hence, according to the exemplary embodiment, the problem of the entanglement of the second wire group 135*bl*, which occurred in the test example, can be solved, thereby overcoming or improving difficulties in the design of circuit boards (such as an increased complexity of wires, an increase in the size of circuit boards, a rise in the cost of manufacturing circuit boards, and so on).

Figure 11:
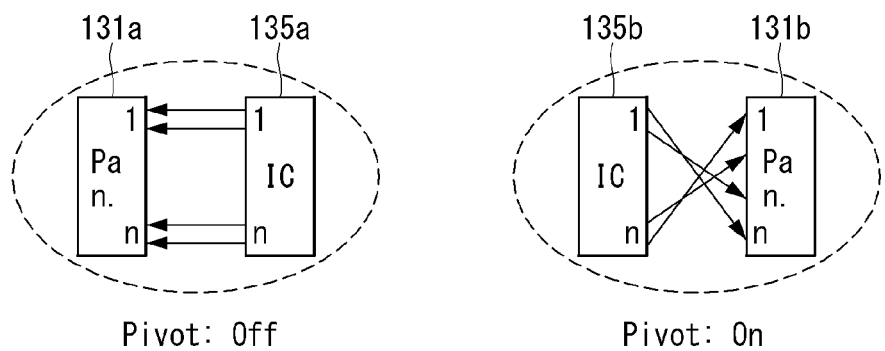
FIG. 11 is an illustration of how the map of pins in a level shifter is changed according to an exemplary embodiment of the present invention.
Figure 12:
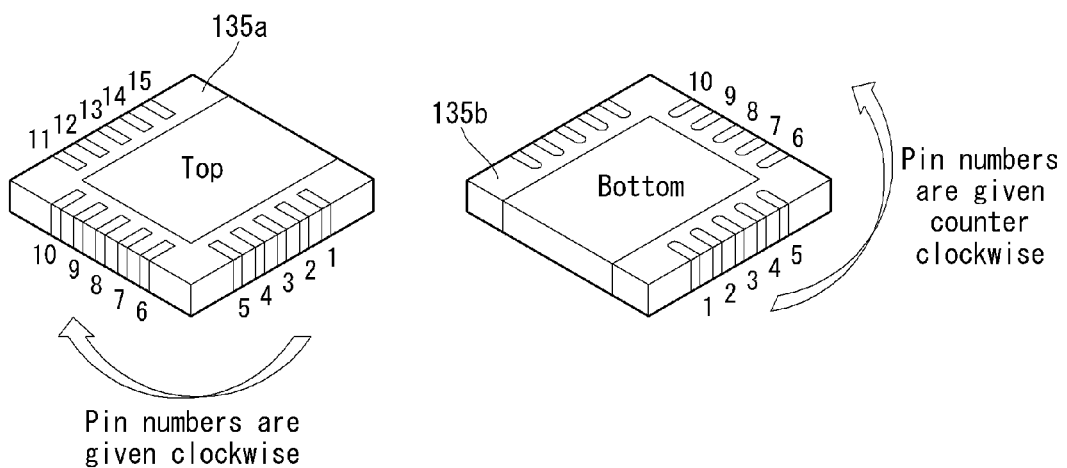
FIG. 12 is an illustration of how the arrangement of pins in a level shifter is altered according to an exemplary embodiment of the present invention.

FIG. 11 is an illustration of how the map of pins in a level shifter is changed according to an exemplary embodiment. FIG. 12 is an illustration of how the arrangement of pins in a level shifter is changed according to an exemplary embodiment.

As shown in FIG. 11, the map of pins inside an IC can be changed in order to place the first level shifter 135*a* and the second level shifter 135*b* according to the exemplary embodiment. For example, the first level shifter 135*a* can be internally designed to have a pivot-off state (or normal state), and the second level shifter 135*b* can be internally designed to have a pivot-on state (or pivot state). That is, the first and second level shifters 135*a* and 135*b* can have different pin maps.

As shown in FIG. 12, the map of pins outside an IC can be changed in order to place the first level shifter 135*a* and the second level shifter 135*b* according to the exemplary embodiment. For example, the first and second level shifters 135*a* and 135*b* can be designed in such a manner that pins are arranged on the top and bottom, with the first level shifter 135*a* mounted on the top and the second level shifter 135*b* mounted on the bottom, or vice versa.

That is, since the level shifters 135*a* and 135*b* have pins arranged on both sides, one of the level shifters 135*a* and 135*b* has a mounting surface (which is attached to a substrate) on the bottom and the other one has a mounting surface on the top. Accordingly, the first level shifter 135*a* appears to be given pin numbers clockwise since the top becomes visible after it is mounted, and the second level shifter 135*b* appears to be given pin numbers counter clockwise since the bottom becomes visible after it is mounted.

Moreover, the pins arranged on both sides of the level shifters 135*a* and 135*b* can have the same shape or different shapes, as shown in the drawing. In a first example, the pins on the top can be rectangular (or pentagonal or polygonal), and the pins on the bottom can be semi-circular (or elliptical) (as shown in FIG. 12).

In a second example, the pins on the top and bottom can have the same shape but vary in size, including enlarging the size of the pins on the top and reducing the size of the pins on the bottom, or they can vary in both size and shape. However, a description will be given below with an example in which pins of the same shape are arranged on the top and bottom.

Figure 13:
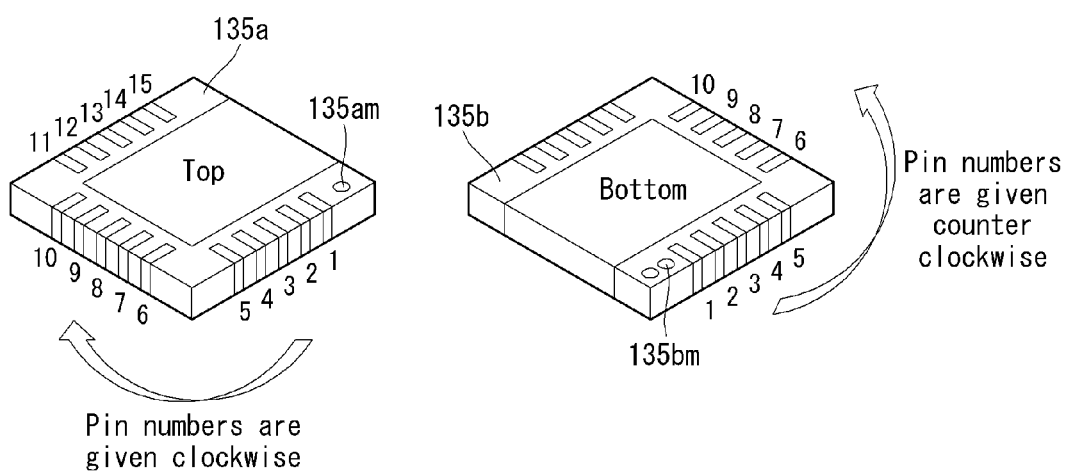
FIG. 13 is a first exemplary view explaining how distinguishing marks are put on the top of one level shifter and the bottom of another level shifter according to an exemplary embodiment of the present invention.
Figure 14:
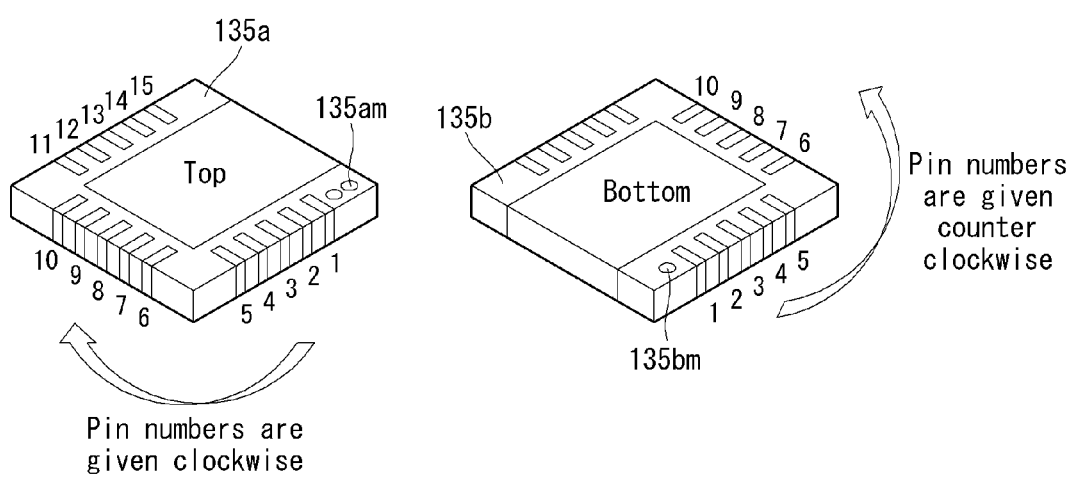
FIG. 14 is a second exemplary view explaining how distinguishing marks are put on the top of one level shifter and the bottom of another level shifter according to an exemplary embodiment of the present invention.
Figure 15:
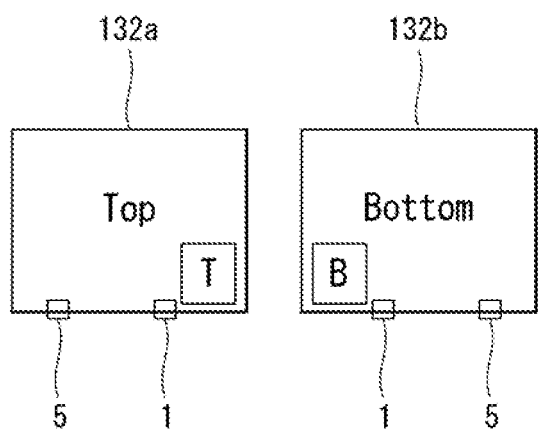
FIG. 15 is a third exemplary view explaining how distinguishing marks are put on the top of one level shifter and the bottom of another level shifter according to an exemplary embodiment of the present invention.
Figure 16:
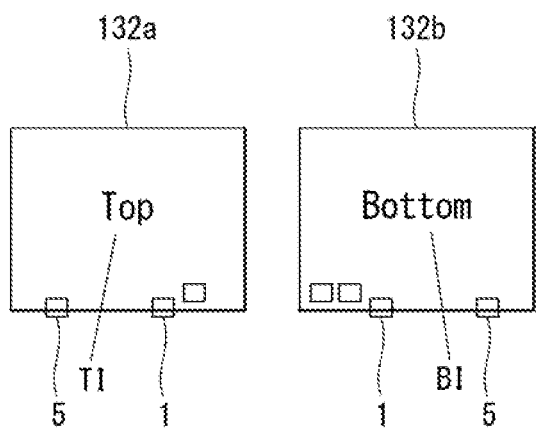
FIG. 16 is a fourth exemplary view explaining how distinguishing marks are put on the top of one level shifter and the bottom of another level shifter according to an exemplary embodiment of the present invention.

FIG. 13 is a first exemplary view explaining how distinguishing marks are put on the top of one level shifter and the bottom of another level shifter according to an exemplary embodiment. FIG. 14 is a second exemplary view explaining how distinguishing marks are put on the top of one level shifter and the bottom of another level shifter according to an exemplary embodiment. FIG. 15 is a third exemplary view explaining how distinguishing marks are put on the top of one level shifter and the bottom of another level shifter according to an exemplary embodiment. FIG. 16 is a fourth exemplary view explaining how distinguishing marks are put on the top of one level shifter and the bottom of another level shifter according to an exemplary embodiment.

As shown in FIG. 13, one circular dot can be placed in a space to the right of the first pin 1 of the first level shifter 135a, and two circular dots can be placed in a space to the left of the first pin 1 of the second level shifter 135b.

The first level shifter 135a where one circular dot is placed can be defined as a normal IC which is mounted in such a way as to make the top visible. The second level shifter 135b where two circular dots are placed can be defined as a top-bottom reversed IC which is mounted in such a way as to make the bottom visible.

As shown in FIG. 14, two circular dots can be placed in a space to the right of the first pin 1 of the first level shifter 135a, and one circular dot can be placed in a space to the left of the first pin 1 of the second level shifter 135b.

The first level shifter 135a where two circular dots are placed can be defined as a normal IC which is mounted in such a way as to make the top visible. The second level shifter 135b where one circular dot is placed can be defined as a top-bottom reversed IC which is mounted in such a way as to make the bottom visible.

As shown in FIG. 15, a letter "T" can be placed in a space to the right of the first pin 1 of the first level shifter 135a, and a letter "B" can be placed in a space to the left of the first pin 1 of the second level shifter 135b.

The first level shifter 135a where a letter "T" is placed can be defined as a normal IC which is mounted in such a way as to make the top visible. The second level shifter 135b where a letter "B" is placed can be defined as a top-bottom reversed IC which is mounted in such a way as to make the bottom visible. That is, the letter "T" refers to the top and at the same time defines an area where the first pin 1 is located, and the letter "B" refers to the bottom and at the same time defines an area where the first pin 1 is located.

As shown in FIG. 16, one rectangular box can be placed in a space to the right of the first pin 1 of the first level shifter 135a, and two rectangular boxes can be placed in a space to the left of the first pin 1 of the second level shifter 135b. Also, a word "Top", which corresponds to an index TI representing the top, can be placed on the surface of the first level shifter 135a, and a word "Bottom", which corresponds to an index BI representing the bottom, can be placed on the surface of the second level shifter 135b.

The first level shifter 135a where a word "Top" is placed can be defined as a normal IC which is mounted in such a way as to make the top visible. The second level shifter 135b where a word "Bottom" is placed can be defined as a top-bottom reversed IC which is mounted in such a way as to make the bottom visible.

Although FIGS. 15 and 16 are illustrated and explained with respect to a letter "T" or word "Top" and a letter "B" or word "Bottom", these letters and words can be replaced with letters and words from the language of a country where the product is adopted. Also, FIGS. 13 to 16 illustrate circular dots and rectangular boxes as figures indicating the positions of the first pins 1, they are only examples, and the first pins 1 can be indicated by other various types of marks. Therefore, figures, numbers, and letters can be used as marks, and one or two marks can be placed to distinguish between the top and the bottom.

Figure 17:
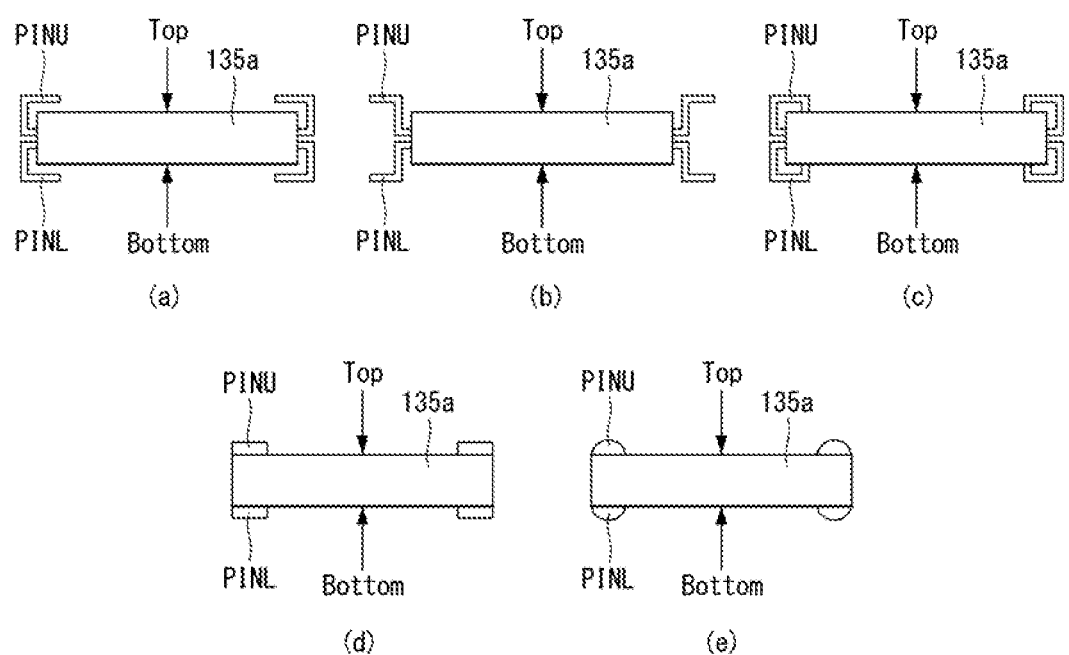
FIG. 17 is a cross-sectional view of pin structures of a level shifter according to an exemplary embodiment of the present invention.
Figure 18:
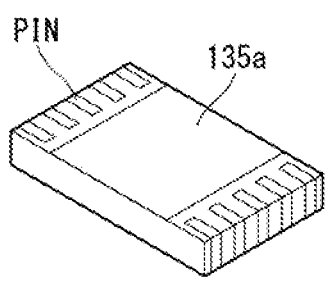
FIG. 18 is a structural diagram of an IC to which a level shifter is applicable according to an exemplary embodiment of the present invention.
Figure 18:
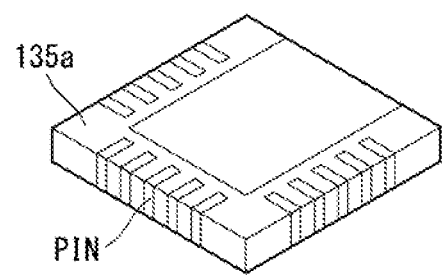
Figure 18:
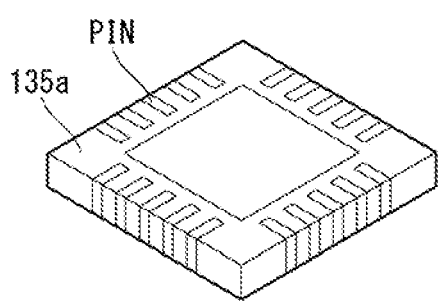

FIG. 17 is a cross-sectional view of pin structures of a level shifter according to an exemplary embodiment of the present invention. FIG. 18 is a structural diagram of an IC to which a level shifter is applicable according to an exemplary embodiment.

As shown in FIG. 17, the first level shifter 135a (the second level shifter is omitted as it is redundant) according to an exemplary embodiment will be described with an example in which the pins arranged on the top and bottom of an IC package's main body have the same shape.

As shown in (a) of FIG. 17, the first level shifter 135a according to an exemplary embodiment comprises upper pins PINU that protrude from the side and are bent in such a way as to face the surface of the top and be parallel to it, and lower pins PINL that protrude from the side and are bent in such a way as to face the surface of the bottom and be parallel to it.

As shown in (b) of FIG. 17, the first level shifter 135a according to an exemplary embodiment comprises upper pins PINU that protrude from the side and are bent in such a way as to not face the surface of the top but be parallel to it, and lower pins PINL that protrude from the side and are bent in such a way as to not face the surface of the bottom but be parallel to it.

As shown in (c) of FIG. 17, the first level shifter 135a according to an exemplary embodiment comprises upper pins PINU that protrude from the side and are bent in such a way as to touch the surface of the top, and lower pins PINL that protrude from the side and are bent in such a way as to touch the surface of the bottom.

As shown in (d) of FIG. 17, the first level shifter 135a according to an exemplary embodiment comprises upper pins PINU that protrude from the surface of the top and have a rectangular or polygonal shape, and lower pins PINL that protrude from the surface of the bottom and have a rectangular or polygonal shape.

As shown in (e) of FIG. 17, the first level shifter 135a according to an exemplary embodiment comprises upper pins PINU that protrude from the surface of the top and have a circular or elliptical shape, and lower pins PINL that protrude from the surface of the bottom and have a circular or elliptical shape.

While (a) through (c) of FIG. 17 illustrate by way of example that the upper pins PINU and the lower pins PINU are bent away from the top and bottom of the first level shifter 135a, they can be bent while adjoining the side, top, and bottom. That is, the upper pins PINU and the lower pins PINU can protrude and be bent while adjoining the side, top, and bottom of the IC package.

As shown in FIG. 18, the first level shifter 135a according to an exemplary embodiment can be applied to a structure ((a) of FIG. 18) in which pins PIN are placed on first and second sides, a structure ((b) of FIG. 18) in which pins PIN are placed on first, second, and third sides, and a structure ((c) of FIG. 18) in which pins PIN are placed on first to fourth sides.

While the exemplary embodiments of the present invention have been described with respect to a specific IC used as a level shifter, in order to solve the problems that can occur in implementing a display device, the present invention is also applicable to ICs, such as level shifters, that can cause design difficulties in implementing a large-area display device. Moreover, the present invention is also applicable to other electronic devices using ICs, as well as display devices. Hence, the present invention is not limited to what has been described above, but should be analyzed in the fields of electronic devices including display devices and in the fields of ICs.

As seen from above, the present invention offers the benefit of overcoming or improving design difficulties by an entanglement of wires (such as an increased complexity of wires, an increase in the size of circuit boards, a rise in the cost of manufacturing circuit boards, and so on), based on ICs that are mountable on both the top and bottom. Another benefit of the present invention is to overcome or improve difficulties in implementing various electronic devices, as well as display devices, based on ICs whose top and bottom can be distinguished, that are mountable on both the top and bottom.

What is claimed is:

1. An integrated circuit comprising:
a main body having a top and a bottom; and
upper pins placed on the top of the main body, and lower pins placed on the bottom of the main body,
wherein each of the upper pins has a first protruding portion protruding straightly toward outside from at least one side of the main body, and a first region extending from the first protruding portion and bent so that at least a portion of the first region faces and parallels the top of the main body, and
wherein each of the lower pins has a second protruding portion straightly protruding toward outside from the at least one side of the main body, and a second region extending from the second protruding portion and bent so that at least a portion of the second region faces and parallels the bottom of the main body.

2. The integrated circuit of claim 1, wherein at least one of a size and a shape of the upper pins and the lower pins are the same or different.

3. An integrated circuit comprising:
a main body having a top and a bottom; and
upper pins placed on the top of the main body, and lower pins placed on the bottom of the main body,
wherein each of the upper pins has a first protruding portion protruding straightly toward outside from at least one side of the main body, and a first region extending from the first protruding portion and bent so that one end of the first region touches a surface of the top main body, and
wherein each of the lower pins has a second protruding portion straightly protruding toward outside from the at least one side of the main body, and a second region extending from the second protruding portion and bent so that one end of the second region touches a surface of the bottom of the main body.

4. A circuit board comprising:
a printed circuit board; and
an integrated circuit mounted on the printed circuit board, the integrated circuit comprising:
a main body having a top and a bottom; and
upper pins placed on the top of the main body, and lower pins placed on the bottom of the main body,
wherein each of the upper pins has a first protruding portion straightly protruding toward outside from at least one side of the integrated circuit, and a first region extending from the first protruding portion and bent so that at least a portion of the first region faces and parallels the top of the main body, and
wherein each of the lower pins has a second protruding portion straightly protruding toward outside from the at least one side of the integrated circuit, and a second region extending from the second protruding portion and bent so that at least a portion of the second region faces and parallels the bottom of the main body.

5. A display device comprising:
a display panel;
a first circuit board and a second circuit board that are placed separately to transmit at least one of a signal and a voltage to the display panel; and
a first integrated circuit and a second integrated circuit that are mounted on the first circuit board and the second circuit board, respectively,
wherein the first integrated circuit and the second integrated circuit include pins having symmetrical pin arrangement,
wherein, when viewed from above, the first integrated circuit appears to be given pin numbers to the pins in a first direction, and the second integrated circuit appears to be given the pin numbers to the pins in a second direction opposite to the first direction,
wherein the first and second integrated circuits each comprise:
a main body having a top and a bottom; and
upper pins placed on the top of the main body, and lower pins placed on the bottom of the main body,
wherein each of the upper pins has a first protruding portion protruding straightly toward outside from at least one side of the main body, and a first region extending from the first protruding portion and bent so that at least a portion of the first region faces and parallels the top of the main body, and
wherein each of the lower pins has a second protruding portion straightly protruding toward outside from the at least one side of the main body, and a second region extending from the second protruding portion and bent so that at least a portion of the second region faces and parallels the bottom of the main body.

6. The display device of claim 5, wherein the first integrated circuit is mounted on the first circuit board so that the top of the main body is visible, and the second integrated circuit is mounted on the second circuit board so that the bottom of the main body is visible.

7. The display device of claim 5, wherein at least one of a size and a shape of the upper pins and the lower pins are the same or different.

8. The display device of claim 5, wherein the first and/or second integrated circuit comprises a level shifter that generates and outputs clock signals.

* * * * *